United States Patent [19]

Maini et al.

[11] Patent Number: 4,926,066
[45] Date of Patent: May 15, 1990

[54] CLOCK DISTRIBUTION CIRCUIT HAVING MINIMAL SKEW

[75] Inventors: Rajnish Maini, Chandler; Harold L. Spangler, Mesa, both of Ariz.

[73] Assignee: Motorola Inc., Schaumburg, Ill.

[21] Appl. No.: 242,666

[22] Filed: Sep. 12, 1988

[51] Int. Cl.$^5$ .................... H01L 21/66; H03L 7/00; H03K 5/13

[52] U.S. Cl. .................... 307/303.1; 307/455; 307/466; 357/40; 357/43

[58] Field of Search ............. 307/303, 455, 456, 466, 307/467, 475, 443, 303.1; 357/40, 43, 72

[56] References Cited

U.S. PATENT DOCUMENTS

| | | | |
|---|---|---|---|
| 3,681,614 | 8/1972 | Kroos | 307/455 |
| 3,829,790 | 9/1974 | MacRander | 331/61 |
| 3,921,079 | 11/1975 | Heffner et al. | 307/262 |
| 3,925,691 | 12/1975 | Gaskill, Jr. et al. | 307/455 |
| 3,955,099 | 5/1976 | Gaskill, Jr. et al. | 307/455 |
| 4,041,326 | 8/1977 | Robinson | 307/455 |
| 4,253,065 | 2/1981 | Wyman et al. | 328/164 |
| 4,479,216 | 10/1984 | Krambeck et al. | 307/265 |
| 4,638,256 | 1/1987 | Hong et al. | 328/105 |
| 4,639,615 | 1/1987 | Lee et al. | 307/269 |
| 4,755,693 | 7/1988 | Suzuki et al. | 307/455 |

FOREIGN PATENT DOCUMENTS

| | | | |
|---|---|---|---|
| 0156829 | 7/1986 | Japan | 357/40 |
| 0052955 | 3/1987 | Japan | 357/40 |
| 2125646 | 3/1984 | United Kingdom | 307/455 |

OTHER PUBLICATIONS

Bakoglu et al., "A Symmetric Clock–Distribution Tree and Optimized High-Speed Interconnections for Reduced Clock" Skew in ULSI and WSI Circuits, an undated paper, pp. 1-6.

Primary Examiner—Stanley D. Miller
Assistant Examiner—Trong Quang Phan
Attorney, Agent, or Firm—Michael D. Bingham

[57] ABSTRACT

A clock distribution circuit for distributing a clock signal to a plurality of other circuits, having a substantially reduced skew between the input signal and the plurality of output signals wherein signals are transmitted from an input gate to a plurality of output gates and output pads along radially disposed metalization lines. The radially disposed metalization lines are terminated at forty five degrees, thereby reducing reflections, and are of equal length for like signals.

8 Claims, 2 Drawing Sheets

CLOCK DISTRIBUTION CIRCUIT HAVING MINIMAL SKEW

FIELD OF THE INVENTION

This invention relates in general to a clock distribution circuit, and more particularly to a circuit for distributing a clock signal to a plurality of other circuits, wherein the skew between the input signal and the plurality of output signals is substantially reduced.

BACKGROUND OF THE INVENTION

Complex circuitry such as high speed computer systems, automatic test equipment, VLSI chips, synchronous machines, self timed RAMS, wafer scale integration circuits and module or board level designs all require clock signals to synchronize the components of the complex circuitry. Because of the difference of the times of propagation of the various elements of a clock distribution circuit for high-to-low and low-to-high transitions, the pulse widths of a clock signal are distorted (skew) by each element through which the clock signal passes. Clock skew is one of the major concerns in high speed digital system design. If two circuits are clocked by two outputs of the same clock drive with relatively large skew, they receive the clock signal at different times. Clock skew system timing problems can then be encountered unless the clock period is much larger than the skew. Consequently, clock skew sets an upper limit on the frequency and the operating speed of the system. At high frequencies the ability of the designer fanout and low skew can be used to improve matching and reduce the physical size of the system.

Thus, what is needed is a circuit for distributing a clock signal to a plurality of other circuits, wherein the skew between the input signal and the plurality of output signals is substantially reduced.

SUMMARY OF THE INVENTION

A monolithically integrated chip comprises a substrate having a planar surface with input and output pads disposed at the periphery of the chip. A plurality of transistors and resistors formed in the planar surface comprise a clock distribution circuit, having an input gate disposed near the center of the planar surface and a plurality of output gates, each disposed between the center of the planar surface and one each of the output pads. A plurality of metalization strips are disposed substantially radially from the input gate at the center of the planar surface to one each of the output gates and from each of the output gates to the respective output pad for transmitting signals thereto.

Accordingly, it is an object of the present invention to provide an improved clock distribution circuit.

Another object of the present invention is to provide a clock distribution circuit having minimal skew.

The above and other objects, features, and advantages of the present invention will be better understood from the following detailed description taken in conjunction with the accompanying drawings.

DETAILED DESCRIPTION OF THE INVENTION

Figure 1:
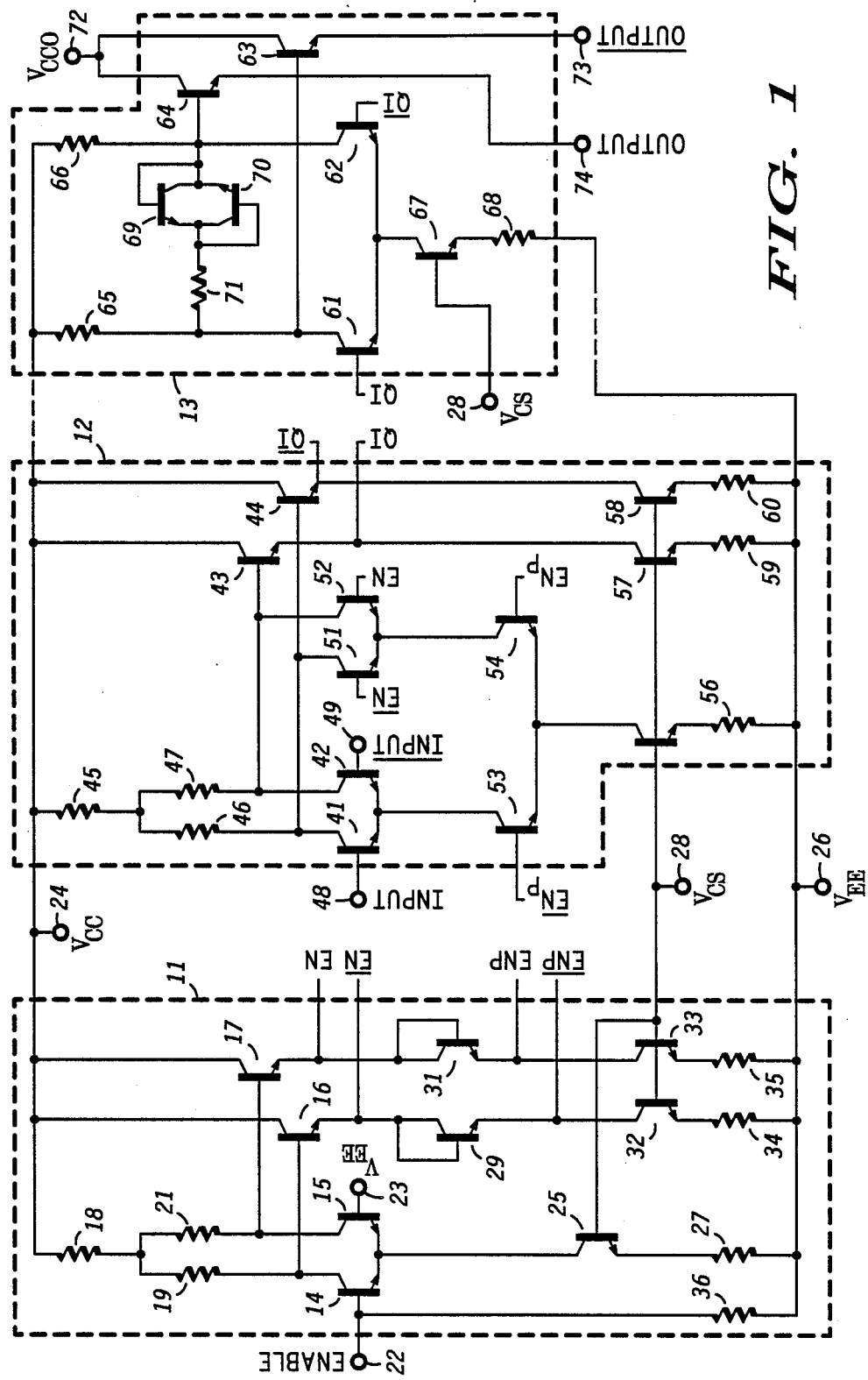
FIG. 1 is a schematic of a clock distribution circuit in accordance with the present invention.
Figure 2:
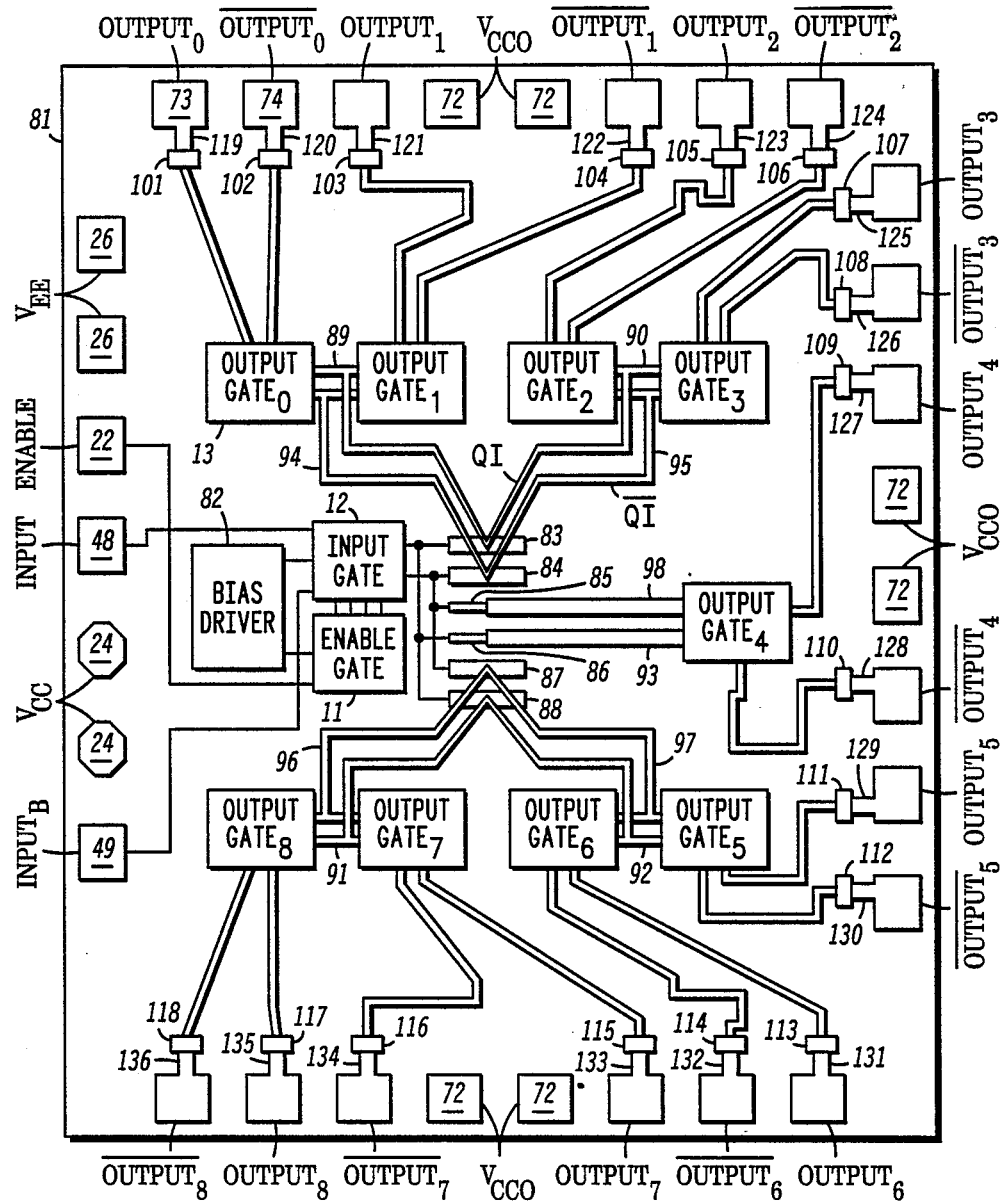
FIG. 2 is a partial block diagram of the cross sectional top plan view of a monolithically integrated circuit of the present invention.

Referring to FIG. 1, a schematic of a clock distribution circuit comprises enable circuit 11, input circuit 12 and output circuit 13. Output circuit 13 as shown in FIG. 1 is one of a plurality of output circuits, each receiving the same signals QI and $\overline{QI}$ from input gate 12. For example, FIG. 2 illustrates nine output gates 13 all connected to input gate 12. Enable circuit 11 includes differentially connected transistors 14 and 15 having collectors coupled to the bases of transistors 16 and 17, respectively, and to resistor 18 by resistors 19 and 21, respectively, and bases coupled to terminals 22 and 23, respectively. Resistor 18 is further connected to supply voltage terminal 24. Current source transistor 25 has its collector connected to the emitters of transistors 14 and 15, its emitter coupled to supply voltage terminal 26 by resistor 27, and its base coupled to terminal 28. Emitter follower transistors 16 and 17 have collectors connected to supply voltage terminal 24, and emitters connected to the base and collector of diode connected transistors 29 and 31, respectively. Current source transistor 32 and 33 have collectors connected to the emitters of transistor 29 and 31, respectively, their emitters coupled to supply voltage terminal 26 by resistors 34 and 35, respectively, and their bases connected to terminal 28. Resistor 36 is coupled between enable terminal 22 and supply voltage terminal 26.

A digitally high enable signal applied to enable terminal 22 bias transistors 14 and 17 on, causing enable signals EN and ENP to go high and complementary enable signals $\overline{EN}$ and $\overline{ENP}$ to go low.

Input circuit 12 includes differentially connected transistors 41 and 42 having their collectors connected to the bases of emitter follower transistors 44 and 43, respectively, and coupled to resistor 45 by resistors 46 and 47, respectively, and their bases connected to input terminals 48 and 49, respectively. Differentially connected transistors 51 and 52 have their collectors connected to the bases of transistors 44 and 43, respectively, and their bases connected to the emitters of transistors 16 and 17, respectively. Differentially connected transistors 53 and 54 have their collectors connected to the emitters of transistor 41 and 42, and 52 and 52, respectively, and their bases connected to the emitters of transistors 29 and 31, respectively. Current source transistors 55 has a collector connected to the emitters of transistors 53 and 54, a base connected to terminal 28, and an emitter coupled to supply voltage terminal 26 by resistor 56. Current source transistors 57 and 58 have their collectors connected to the emitters of transistor 43 and 44, respectively, their emitters coupled to supply voltage terminal 26 by resistors 59 and 60, respectively, and their bases connected to terminal 28.

When a digitally high input signal INPUT is applied to input terminal 48, transistors 41 and 43 are biased on, and when enable signal ENABLE is also high, signal QI is high and signal $\overline{QI}$ is low.

Output circuit 13 includes differentially connected transistors 61 and 62 having their collectors connected to the bases of emitter follower transistor 63 and 64 and coupled to supply voltage terminal 24 by resistors 65 and 66, respectively, and their bases connected to the emitters of transistors 43 and 44, respectively, for receiving signals QI and QI. Current source transistor 67 had a collector connected to the emitters of transistors 61 and 62, respectively, a base connected to terminal 28, and an emitter coupled to supply voltage terminal 26 by resistor 68. Diode connected transistor 69 has a base and collector connected to the collector of transistor 62 and to the emitter of diode connected transistor 70. Transistor 70 has its base and collector coupled to the collector of transistor 61 by resistor 71. Transistors 63 and 64 have their collectors connected to supply voltage terminal 72 and their emitters connected to output terminals 73 and 74 for providing output signals $\overline{OUTPUT}$ and OUTPUT, respectively.

When signal QI is digitally high, transistors 61 and 64 are biased on, causing output signal OUTPUT to go high and output signal $\overline{OUTPUT}$ to go low.

The clock distribution circuit of FIG. 1 is completely differential. The two gate design increases the level of gain and also makes it easier to disable the outputs. Furthermore, the skew is reduced by balancing the parasitic capacitive effects on the bases of transistors 43 and 44 by the arrangement of transistors 41, 42, 51, 52, 53 and 54.

Referring to FIG. 2, the layout of the present invention is shown and comprises substrate 81 having input pads 22, 24, 26, 48, 49, and 72 and output pads 73 and 74 disposed on the periphery of the substrate 81. These pads are numbered similarly to the pads of FIG. 1 for which they represent. In addition to output pads 73 and 74, sixteen additional output pads and $\overline{OUTPUT_0}$ and OUTPUT$_0$, OUTPUT$_1$ through OUTPUT$_8$ and complementary $\overline{OUTPUT_1}$ through $\overline{OUTPUT_8}$ are disposed on the periphery of the substrate. The location of these pads is pertinent to reducing skew. Input pads 48 and 49 are located at a substantially equal distance from and on opposite sides of supply voltage pad 24. Output pads OUTPUT$_1$ and $\overline{OUTPUT_1}$, OUTPUT$_4$ and $\overline{OUTPUT_4}$, and OUTPUT$_7$ and $\overline{OUTPUT_7}$ are all located at a substantially equal distance from and on opposite sides of supply voltage pads 72. Additionally, other output pads are placed at a substantially equal distance from and on opposite sides of power supply pads, i.e., output pads 73 $\overline{OUTPUT_0}$ and 74 $\overline{OUTPUT_0}$, and $\overline{OUTPUT_2}$ and $\overline{OUTPUT_2}$. The placing of complementary outputs in close proximity to each other on the same side of the chip in this manner creates a virtual ground plane therebetween, thus minimizing the inductive effects on performance. The location of supply voltage pads 24, 26 and 72 in the middle of the side of the substrate aids in reducing the inductive effects. Three supply voltage pads $V_{CCO}$ 72 maintain balanced loading and symmetry.

Enable gate 11, input gate 12 and OUTPUT GATE$_0$ through OUTPUT GATE$_8$ and $\overline{OUTPUT_0}$ through $\overline{OUTPUT_8}$ are coupled together electrically as shown in FIG. 1. The bias driver 82 is additional circuitry for providing voltages to the other circuits. For ease of understanding the layout of the clock distribution circuit, the metalization providing the voltages from supply voltage pads 24, 26 and 72 are not shown.

The signals QI and $\overline{QI}$ from input gate 12 is provided to metal strips 83 84,85,86,87 and 88. The lengths of metal strips 83, 84, 85, 86, 87 and 88 may be trimmed to adjust parasitic capacitance. Signal QI is then transmitted radially along metal strips 89, 90, 91, 92, and 93, and signal $\overline{QI}$ is transmitted radially along metal strips 94, 95, 96, 97 and 98 to respective output gate. Output signals OUTPUT and $\overline{OUTPUT}$ from each of the output gates OUTPUT GATE$_0$ through $\overline{OUTPUT}$ GATE$_8$ are coupled to power output transistors 101 through 118, respectively. The power output transistors 101 through 118 are coupled to the respective output pad by metal strips 119 through 136, respectively.

Skew is the propagation delay between the plurality of outputs 73 and 74 relative to a common input 48 and 49. Skew minimization is attained through careful layout of the chip, pinout selection and circuit architectural symmetry. Layout enhancements provided by this invention include even distribution of signals and loading through radial layout, avoidance of sharp signal interconnect metalization angles and matched interconnect path lengths. Minimizing switching current effects on the package inductanceresistance-capacitance parasitics is obtained by pad placement. To further reduce skew, circuit architecture is totally differential, including the internal enable signal path, with attention given to transistor parasitic matching.

By now it should be appreciated that there has been provided a circuit for distributing a clock signal to a plurality of other circuits, wherein the skew between the input signal and the plurality of output signals is substantially reduced.

We claim:

1. A monolithically integrated chip comprising:
    a substrate having a planar surface;
    input and output pads disposed at the periphery of said chip; said pads including pads for supply voltage for operating said chip; a circuit for providing a plurality of output clock signals in response to an input clock signal from one of said input pads, said output signals being transmitted substantially radially from substantially the center of said planar surface along metalization strips substantially equal in length from said circuit to said output for maintaining substantially equal propagation delays for said input clock signal and said output signals thereby substantially reducing the skew therebetween.

2. A monolithically integrated chip comprising:
    a substrate having a planar surface, said planar surface having first, second, third and fourth sides at the periphery of said chip;
    an input pad disposed on the first side for receiving an input signal;
    an input gate formed in said planar surface and coupled to said input pad;
    a plurality of output pads disposed on said second, third and fourth sides;
    first means disposed substantially in the center of said planar surface and coupled to said input gate for transmitting first and second signals from said input gate, wherein said first means has trimmable capacitive means for applying capacitive bias to said first and second signals;
    a plurality of output gates, each disposed on said planar surface generally between said first means and each of said output pads;
    second means coupled between said first means and said plurality of output gates for transmitting said first and second signals and disposed substantially radially on said planar surface; and
    third means coupled between said output gates and said output to one of said output pads.

3. The monolithically integrated chip according to claim 2 wherein said second means comprises a metalization layer defining a plurality of strips, each of said strips disposed from said first means to at least one each of said output gates.

4. The monolithically integrated chip according to claim 3 wherein said first means comprises a plurality of metal strips, each of said metal strips placed apart and parallel to one another, wherein the length of each of said metal strips is selectable for adjusting said capacitive bias associated therewith.

5. The monolithically integrated chip according to claim 4 wherein said third means comprises a plurality of power output transistors, each coupled to one of said output pads; and fourth means comprising a plurality of metalization strips, one each of said metalization strips disposed between one of said output gates and said one of said power output transistors, said metalization strips disposed substantially radially from said respective output gate.

6. The monolithically integrated chip according to claim 5 further comprising:

a first supply voltage pad disposed substantially at the center of said second side and coupled to said output gates disposed on said second side;

a second supply voltage pad disposed substantially at the center of said third side and coupled to said output gates disposed on said third side;

a third supply voltage pad disposed substantially at the center of said fourth side and coupled to said output gates disposed on said fourth side, wherein said plurality of output pads on each of said second, third and fourth sides of said planar surface are spaced apart along the respective side and equally disposed on either side of the respectively supply voltage pad.

7. A monolithically integrated clock distribution circuit, comprising:

a substrate having a planar surface;

an input terminal;

a plurality of output terminals disposed at the periphery of said planar surface;

an input gate coupled to said input terminal; and a plurality of output gates disposed substantially in the center of said planar surface, each responsive to said input gate and coupled to one of said output terminals through equal length metalization strips, wherein the propagation delay between an input signal applied to said input terminal and an output signal on each of said plurality of output terminals is substantially two gate delays.

8. A monolithically integrated clock distribution circuit comprising:

a first supply voltage terminal;

a second supply voltage terminal;

an input terminal for receiving an input signal;

an enable terminal;

a plurality of output terminals;

an enable gate coupled to said enable terminal for providing first and second enable signals;

an input gate comprising:

a first differential pair of transistors having their collectors coupled to first and second nodes, respectively, said first and second nodes coupled to said first supply voltage terminal, and their bases responsive to said input signal;

a second differential pair of transistors having their collectors coupled to said first and second nodes, respectively, and their bases responsive to said first enable signal; and a third differential pair of transistors having their collectors coupled to the emitters of first differential pair of transistors and said second differential pair of transistors, respectively, their bases responsive to said second enable signal, and their emitters coupled to said second supply voltage terminal; and a plurality of output gates, each coupled between one of said first and second node, and one of said plurality of output pads.

* * * * *